(12) United States Patent
Endo et al.

(10) Patent No.: US 7,029,827 B2
(45) Date of Patent: Apr. 18, 2006

(54) PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 300 days.

(21) Appl. No.: 10/610,920

(22) Filed: Jul. 2, 2003

(65) Prior Publication Data

US 2004/0009433 A1 Jan. 15, 2004

(30) Foreign Application Priority Data

Jul. 15, 2002 (JP) ............................. 2002-205757

(51) Int. Cl.
*G03C 5/00* (2006.01)
(52) U.S. Cl. ...................... 430/315; 430/324; 430/327; 430/330
(58) Field of Classification Search ................ 430/315, 430/324, 327, 330
See application file for complete search history.

(56) References Cited

U.S. PATENT DOCUMENTS 6,054,255 A * 4/2000 Nakaoka et al. ............ 430/327

FOREIGN PATENT DOCUMENTS

JP 2003-29410 1/2003

* cited by examiner

*Primary Examiner*—Christopher G. Young
(74) *Attorney, Agent, or Firm*—McDermott Will & Emery LLP

(57) ABSTRACT

After forming a resist film from a positive chemically amplified resist material, an insolubilization treatment for making the surface of the resist film insoluble in a developer is carried out. After the insolubilization treatment, pattern exposure is performed by selectively irradiating the resist film with exposing light. Thereafter, the resist film is developed so as to form a resist pattern made of an unexposed portion of the resist film.

4 Claims, 3 Drawing Sheets

PATTERN FORMATION METHOD

BACKGROUND OF THE INVENTION

The present invention relates to a pattern formation method for use in fabrication process for a semiconductor integrated circuit.

In accordance with the increased degree of integration of semiconductor integrated circuits and downsizing of semiconductor devices, there are increasing demands for further rapid development of lithography technique.

Currently, pattern formation is carried out through photolithography using exposing light of a mercury lamp, KrF excimer laser, ArF excimer laser or the like, and exposure systems are earnestly being developed in reducing the wavelength of exposing light and in increasing the NA (numerical aperture) of a demagnification projection lens.

In accordance with such development of the exposure systems, it is necessary to further improve the accuracy of the optical system, and a problem of unnecessary exposure caused by leakage light (flare) other than light necessary for the exposure has become more serious as a pattern to be formed is finer.

Now, a conventional pattern formation method will be described with reference to FIGS. 3A through 3D.

First, a chemically amplified resist material having the following composition is prepared:

| | |
|---|---|
| Base polymer: poly((methoxymethyl acrylate) - (γ-butyrolactone methacrylate)) (wherein methoxymethyl acrylate:γ-butyrolactone methacrylate = 35 mol %:65 mol %) | 2 g |
| Acid generator: succinimide benzene sulfonate | 0.04 g |
| Solvent: propylene glycol monomethyl ether acetate | 20 g |

Next, as shown in FIG. 3A, the chemically amplified resist material having the aforementioned composition is applied on a substrate 1, so as to form a resist film 2 with a thickness of 0.3 μm. Thereafter, as shown in FIG. 3B, the resist film 2 is subjected to pattern exposure by irradiating with ArF excimer laser 3 through a photomask 4.

Then, as shown in FIG. 3C, the substrate 1 is annealed with a hot plate at a temperature of 100° C. for 60 seconds. Thus, an exposed portion 2a of the resist film 2 becomes soluble in an alkaline developer because an acid is generated from the acid generator therein while an unexposed portion 2b of the resist film 2 remains to be insoluble in an alkaline developer because no acid is generated from the acid generator therein.

Subsequently, the resist film 2 is developed with a 2.38 wt % tetramethylammonium hydroxide developer (alkaline developer). Thus, a resist pattern 5 made of the unexposed portion 2b of the resist film 2 is obtained.

As shown in FIG. 3D, however, the resist pattern 5 is in a defective cross-sectional shape. When such a defective resist pattern 5 is used as a mask for etching a target film, the resultant pattern is also in a defective shape, which lowers the yield in the semiconductor fabrication process.

SUMMARY OF THE INVENTION

In consideration of the aforementioned conventional problem, an object of the invention is forming a resist pattern in a good shape.

In order to achieve the object, the present inventors have studied the cause of the defective cross-sectional shape of the conventional resist pattern. As a result, it has been found that the resist pattern is in the defective shape because the acid is generated from the acid generator in a peripheral portion of the unexposed portion due to flare of exposing light reaching the unexposed portion of the resist film. The present invention was devised on the basis of the finding, and according to the invention, the surface of a resist film is made insoluble in a developer previous to pattern exposure.

The pattern formation method of this invention includes the steps of forming a resist film from a positive chemically amplified resist material; performing an insolubilization treatment for making a surface of the resist film insoluble in a developer; performing pattern exposure by selectively irradiating the resist film with exposing light after the insolubilization treatment; and forming a resist pattern made of an unexposed portion of the resist film by developing the resist film after the pattern exposure.

In the pattern formation method of this invention, the pattern exposure and the development are carried out after making the surface of the resist film insoluble in the developer, and therefore, the surface of the resist film is minimally dissolved in the developer. Accordingly, even when an acid is generated in an unexposed portion of the resist film because it is irradiated with flare during the pattern exposure, the unexposed portion of the resist film is minimally dissolved in the developer. As a result, a resist pattern made of the unexposed portion of the resist film can be formed in a good shape.

In the pattern formation method of this invention, the insolubilization treatment preferably includes a step of exposing the surface of the resist film to an alkaline aqueous solution.

Thus, the surface of the resist film can be definitely made insoluble in the developer.

In this case, the alkaline aqueous solution can be a tetramethylammonium hydroxide aqueous solution or a choline aqueous solution.

In the pattern formation method of this invention, the insolubilization treatment preferably includes a step of exposing the surface of the resist film to plasma.

Thus, the surface of the resist film can be definitely made insoluble in the developer.

In this case, the plasma can be derived from a gas including fluorine or a gas including chlorine.

In the pattern formation method of this invention, a protection ratio that is a ratio of a polymer protected by a protecting group in a whole alkali-soluble polymer included in the chemically amplified resist material is preferably 50% or more.

Thus, 50% or more of the alkali-soluble polymer in the unexposed portion of the resist film is protected by the protecting group, and hence, the unexposed portion of the resist film is minimally dissolved in the developer. Accordingly, influence of the flare on the unexposed portion of the resist film can be reduced.

In this case, the protecting group can be a t-butyl group, a t-butyloxycarbonyl group or an adamantyl group.

In the pattern formation method of this invention, an acid generator included in the chemically amplified resist material is preferably an onium salt.

Thus, in the case where the unexposed portion of the resist film is irradiated with the flare, the amount of acid generated from the onium salt in the unexposed portion of the resist film is comparatively small, and hence, the influence of the flare on the unexposed portion of the resist film can be reduced.

In this case, the onium salt can be triphenylsulfonium trifluoromethanesulfonate or triphenylsulfonium nonafluorobutanesulfonate.

DETAILED DESCRIPTION OF THE INVENTION

Embodiment 1

A pattern formation method according to Embodiment 1 of the invention will now be described with reference to FIGS. 1A through 1E.

First, a chemically amplified resist material having the following composition is prepared:

| | |
|---|---|
| Base polymer: poly((2-methyl-2-adamantyl acrylate) - (γ-butyrolactone methacrylate)) (wherein 2-methyl-2-adamantyl acrylate:γ-butyrolactone methacrylate = 60 mol %:40 mol %) | 2 g |
| Acid generator: triphenylsulfonium triflate | 0.04 g |
| Solvent: propylene glycol monomethyl ether acetate | 20 g |

Figure 1A:
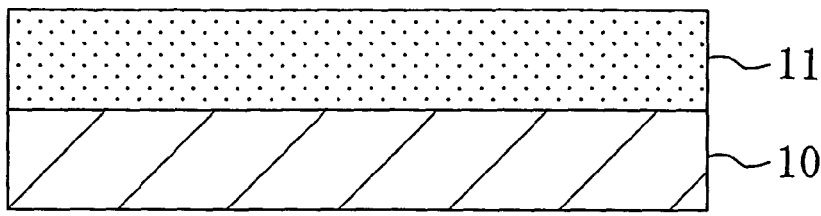
FIGS. 1A, 1B, 1C, 1D and 1E are cross-sectional views for showing procedures in a pattern formation method according to Embodiment 1 of the invention.
Figure 1B:
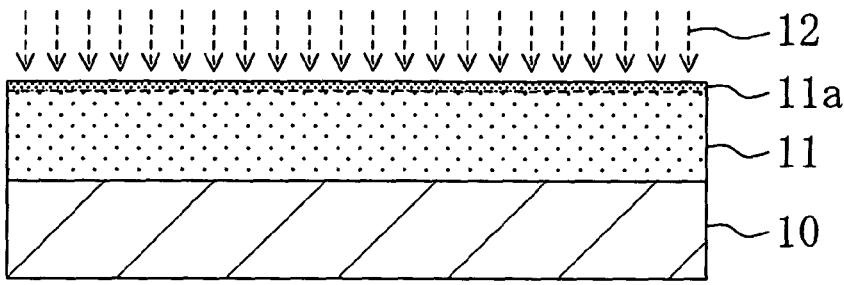

Next, as shown in FIG. 1A, the aforementioned chemically amplified resist material is applied on a substrate 10, so as to form a resist film 11 with a thickness of 0.3 μm. Thereafter, as shown in FIG. 1B, a plasma treatment is carried out by exposing the resist film 11 to plasma 12 derived from a $CHF_3$ gas for 10 seconds under conditions of 1.33 Pa and 50 W. Through this plasma treatment, an insoluble layer 11a is formed in a surface portion of the resist film 11.

Figure 1C:
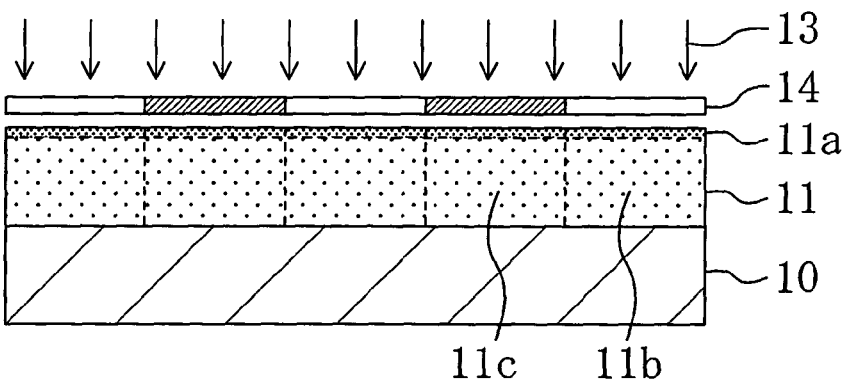
Figure 1D:
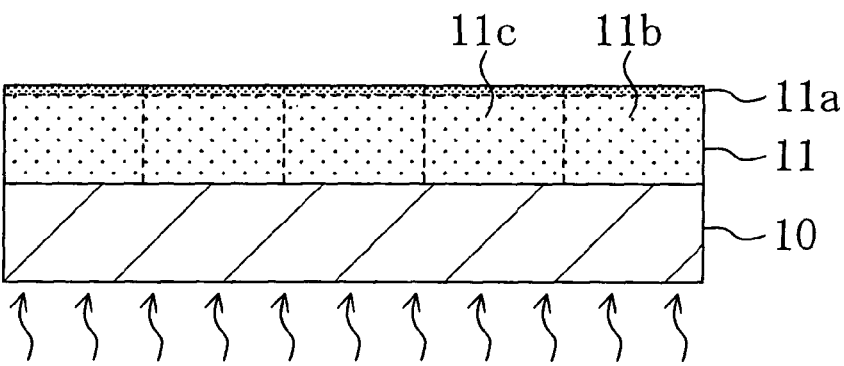

After the plasma treatment, as shown in FIG. 1C, the resist film 11 is subjected to pattern exposure by irradiating with ArF excimer laser 13 through a photomask 14. After the pattern exposure, as shown in FIG. 1D, the resist film 11 is annealed with a hot plate at a temperature of 100° C. for 60 seconds. Thus, an exposed portion 11b of the resist film 11 becomes soluble in an alkaline developer because an acid is generated from the acid generator therein while an unexposed portion 11c of the resist film 11 remains to be insoluble in an alkaline developer because no acid is generated from the acid generator therein.

Figure 1E:
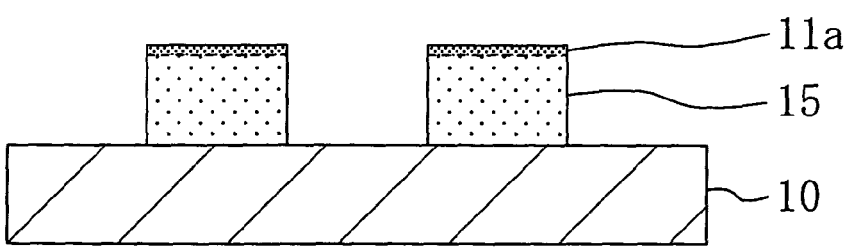

Next, the resist film 11 is developed with a 2.38 wt % tetramethylammonium hydroxide developer (alkaline developer). Thus, as shown in FIG. 1E, a resist pattern 15 with a line width of 0.11 μm made of the unexposed portion 11c of the resist film 11 can be obtained.

According to Embodiment 1, the pattern exposure and the development are carried out after making the surface of the resist film 11 insoluble in the developer by exposing the resist film 11 to the plasma 12, and therefore, the surface of the resist film 11 is minimally dissolved in the developer. Accordingly, even when the unexposed portion 11c of the resist film 11 is irradiated with the flare during the pattern exposure and the acid is generated therein, the unexposed portion 11c of the resist film 11 is minimally dissolved in the developer. As a result, the resist pattern 15 made of the unexposed portion 11c of the resist film 11 can be formed in a good shape.

Also in Embodiment 1, a protection ratio, that is, a ratio of a polymer protected by a protecting group in a whole alkali-soluble polymer included in the chemically amplified resist material, is 50% or more and specifically 60%. Therefore, the unexposed portion 11c of the resist film 11 is minimally dissolved in the developer, and hence, the influence of the flare on the unexposed portion 11c of the resist film 11 can be reduced. In this case, the protecting group may be, for example, a t-butyl group, a t-butyloxycarbonyl group, an adamantyl group or the like.

Furthermore, since the acid generator included in the chemically amplified resist material is an onium salt in Embodiment 1, the amount of acid generated from the onium salt in the unexposed portion 11c of the resist film 11 is comparatively small. Therefore, in the case where the unexposed portion 11c of the resist film 11 is irradiated with the flare, the influence of the flare on the unexposed portion 11c of the resist film 11 can be reduced. In this case, the onium salt may be triphenylsulfonium trifluoromethanesulfonate or triphenylsulfonium nonafluorobutanesulfonate.

Although $CHF_3$ is used as the plasma seed in Embodiment 1, it may be replaced with another plasma seed including fluorine, such as $CH_2F_2$, $CH_3F$, $CF_4$, $C_2F_6$ or $C_3F_8$, or including chlorine, such as $CHCl_3$, $CH_2Cl_2$, $CH_3Cl$, $CCl_4$, $C_2Cl_6$ or $C_3Cl_8$, which does not limit the invention.

Embodiment 2

A pattern formation method according to Embodiment 2 of the invention will now be described with reference to FIGS. 2A through 2E.

First, a chemically amplified resist material having the following composition is prepared:

| | |
|---|---|
| Base polymer: poly((methoxymethyl acrylate) - (γ-butyrolactone methacrylate)) (wherein methoxymethyl acrylate:γ-butyrolactone methacrylate = 65 mol %:35 mol %) | 2 g |
| Acid generator: succinimide benzene sulfonate | 0.04 g |
| Solvent: propylene glycol monomethyl ether acetate | 20 g |

Figure 2A:
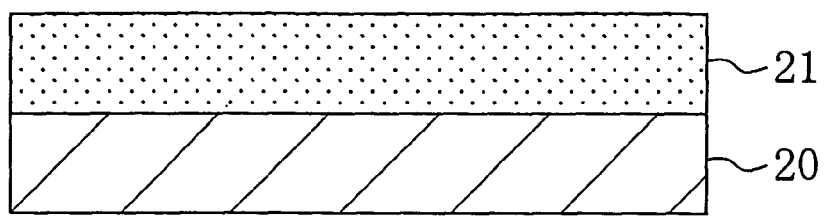
FIGS. 2A, 2B, 2C, 2D and 2E are cross-sectional views for showing procedures in a pattern formation method according to Embodiment 2 of the invention.
Figure 2B:
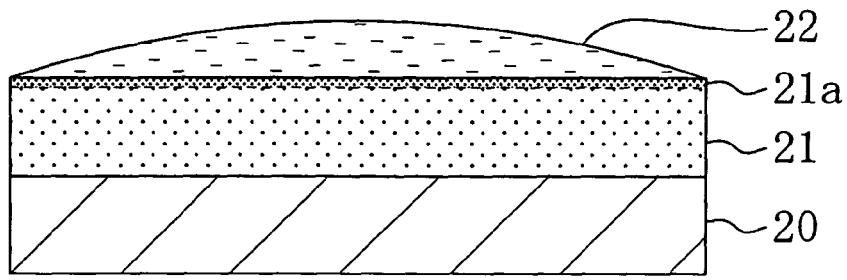

Next, as shown in FIG. 2A, the aforementioned chemically amplified resist material is applied on a substrate 20, so as to form a resist film 21 with a thickness of 0.3 μm. Thereafter, as shown in FIG. 2B, an alkaline aqueous solution 22 of, for example, a 1.0 wt % tetramethylammonium hydroxide aqueous solution is supplied onto the surface of the resist film 21 for 60 seconds. Through this treatment with the alkaline aqueous solution 22, an insoluble layer 21a is formed in a surface portion of the resist film 21.

Figure 2C:
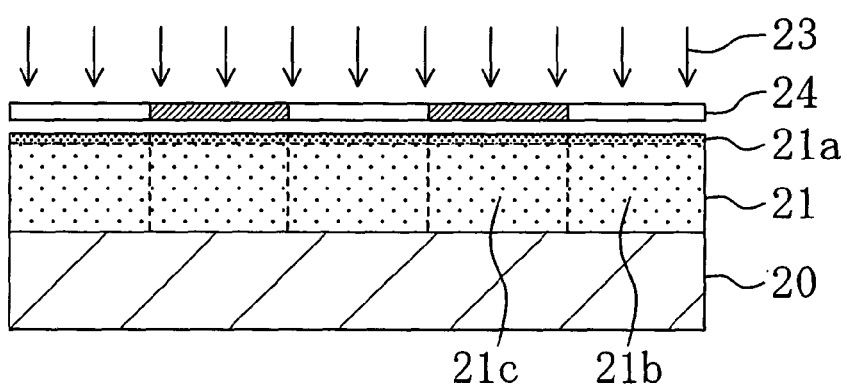
Figure 2D:
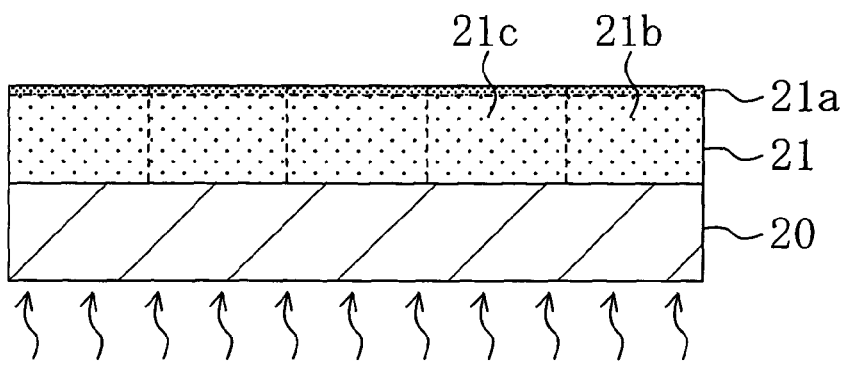

After the treatment with the alkaline aqueous solution 22, as shown in FIG. 2C, the resist film 21 is subjected to pattern exposure by irradiating with ArF excimer laser 23 through a photomask 24. After the pattern exposure, as shown in FIG. 2D, the resist film 21 is annealed with a hot plate at a temperature of 100° C. for 60 seconds. Thus, an exposed portion 21b of the resist film 21 becomes soluble in an alkaline developer because an acid is generated from the acid generator therein while an unexposed portion 21c of the resist film 21 remains to be insoluble in an alkaline developer because no acid is generated from the acid generator therein.

Figure 2E:
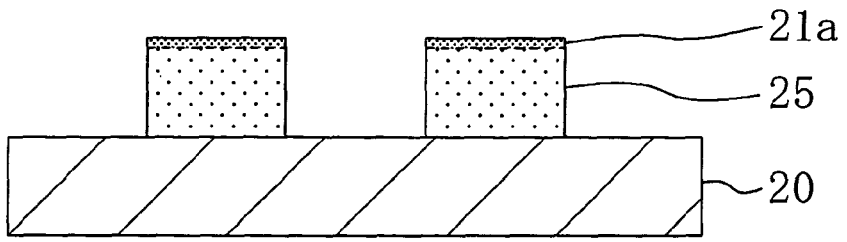
Figure 3A:
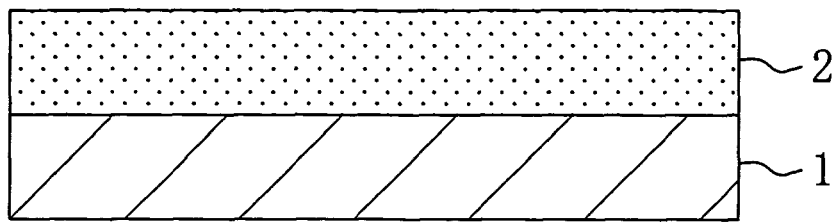
FIGS. 3A, 3B, 3C and 3D are cross-sectional views for showing procedures in a conventional pattern formation method.
Figure 3B:
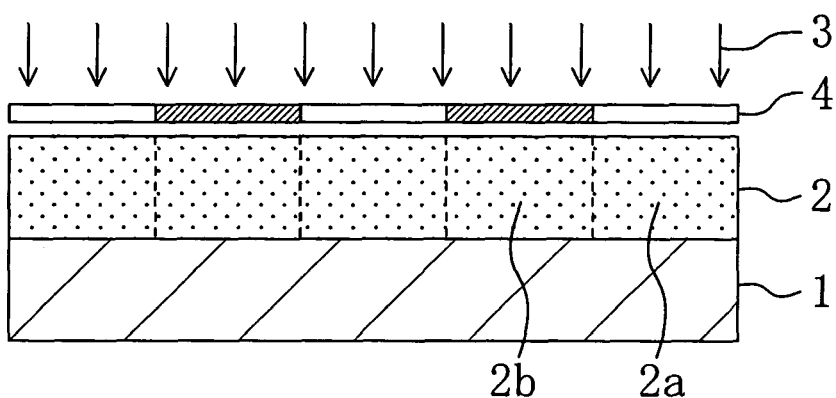
Figure 3C:
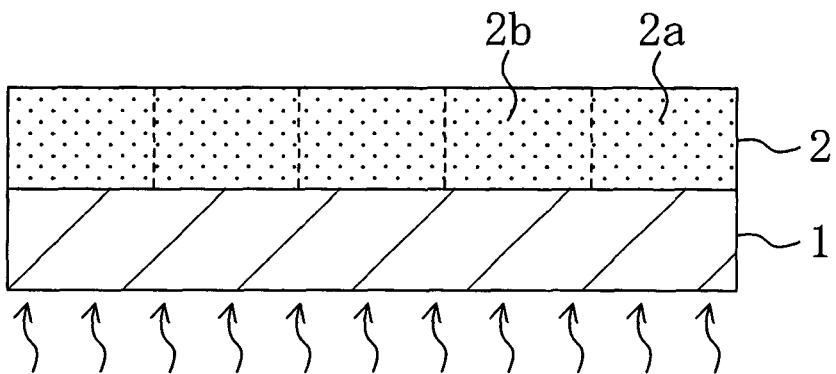
Figure 3D:
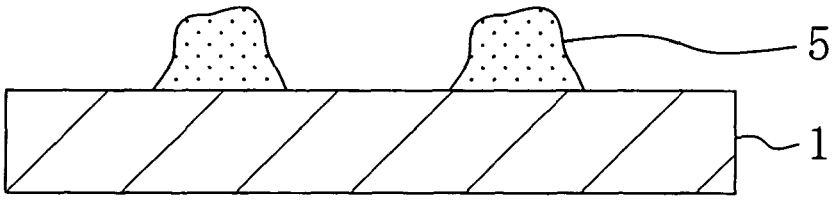

Next, the resist film 21 is developed with a 2.38 wt % tetramethylammonium hydroxide developer (alkaline developer). Thus, as shown in FIG. 2E, a resist pattern 25 with a line width of 0.11 µm made of the unexposed portion 21c of the resist film 21 can be obtained.

According to Embodiment 2, the pattern exposure and the development are carried out after making the surface of the resist film 21 insoluble in the developer by supplying the alkaline aqueous solution 22 onto the surface of the resist film 21, and therefore, the surface of the resist film 21 is minimally dissolved in the developer. Accordingly, even when the unexposed portion 21c of the resist film 21 is irradiated with the flare during the pattern exposure and the acid is generated therein, the unexposed portion 21c of the resist film 21 is minimally dissolved in the developer. As a result, the resist pattern 25 made of the unexposed portion 21c of the resist film 21 can be formed in a good shape.

Also in Embodiment 2, a protection ratio, that is, a ratio of a polymer protected by a protecting group in a whole alkali-soluble polymer included in the chemically amplified resist material, is 50% or more and specifically 65%. Therefore, the unexposed portion 21c of the resist film 21 is minimally dissolved in the developer, and hence, the influence of the flare on the unexposed portion 21c of the resist film 21 can be reduced. In this case, the protecting group may be, for example, a t-butyl group, a t-butyloxycarbonyl group, an adamantyl group or the like.

Although the tetramethylammonium hydroxide aqueous solution is used as the alkaline aqueous solution in Embodiment 2, a choline aqueous solution may be used instead.

What is claimed is:

1. A pattern formation method comprising the steps of:
   (a) forming a resist film from a positive chemically amplified resist material;
   (b) performing an insolubilization treatment for making a surface of said resist film insoluble in a developer;
   (c) performing pattern exposure by selectively irradiating said resist film with exposing light after the insolubilization treatment; and
   (d) annealing said resist film after the pattern exposure; and
   (e) forming a resist pattern made of an unexposed portion of said resist film by developing said resist film after step (d),
   wherein the insolubilization treatment includes a step of exposing the surface of said resist film to an alkaline aqueous solution, and
   said alkaline aqueous solution is a tetramethylammonium hydroxide aqueous solution or a choline aqueous solution.

2. A pattern formation method comprising the steps of:
   (a) forming a resist film from a positive chemically amplified resist material;
   (b) performing an insolubilization treatment for making a surface of said resist film insoluble in a developer;
   (c) performing pattern exposure by selectively irradiating said resist film with exposing light after the insolubilization treatment; and
   (d) annealing said resist film after the pattern exposure; and
   (e) forming a resist pattern made of an unexposed portion of said resist film by developing said resist film after step (d),
   wherein the insolubilization treatment includes a step of exposing the surface of said resist film to plasma.

3. The pattern formation method of claim 2,
   wherein said plasma is derived from a gas including fluorine or a gas including chlorine.

4. A pattern formation method comprising the steps of:
   (a) forming a resist film from a positive chemically amplified resist material;
   (b) performing an insolubilization treatment for making a surface of said resist film insoluble in a developer;
   (c) performing pattern exposure by selectively irradiating said resist film with exposing light after the insolubilization treatment; and
   (d) annealing said resist film after the pattern exposure; and
   (e) forming a resist pattern made of an unexposed portion of said resist film by developing said resist film after step (d),
   wherein an acid generator included in said chemically amplified resist material is an onium salt, and
   said onium salt is triphenylsulfonium trifluoromethanesulfonate or triphenylsulfonium nonafluorobutanesulfonate.

* * * * *